(12) United States Patent
Brigante et al.

(10) Patent No.: US 7,245,025 B2
(45) Date of Patent: Jul. 17, 2007

(54) LOW COST BONDING PAD AND METHOD OF FABRICATING SAME

(75) Inventors: Jeffrey Alan Brigante, Colchester, VT (US); Zhong-Xiang He, Essex Junction, VT (US); Barbara Ann Waterhouse, Richmond, VT (US); Eric Jeffrey White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,653

(22) Filed: Nov. 30, 2005

(65) Prior Publication Data

US 2007/0120216 A1    May 31, 2007

(51) Int. Cl.
*H01L 23/48* (2006.01)
(52) U.S. Cl. ............... 257/779; 257/781; 257/734
(58) Field of Classification Search .......... 257/499, 257/506, 781, E23.02; 438/597
See application file for complete search history.

(56) References Cited

U.S. PATENT DOCUMENTS

| | | | |
|---|---|---|---|
| 5,695,810 A * | 12/1997 | Dubin et al. ............ 438/643 |
| 6,132,586 A * | 10/2000 | Adams et al. ........... 205/123 |
| 6,239,494 B1 * | 5/2001 | Besser et al. ........... 257/762 |
| 6,528,409 B1 | 3/2003 | Lopatin et al. |
| 6,593,220 B1 * | 7/2003 | Yu et al. ................ 438/612 |
| 6,730,982 B2 | 5/2004 | Barth et al. |
| 6,821,909 B2 | 11/2004 | Ramanathan et al. |
| 2001/0000416 A1 | 4/2001 | Uzoh |
| 2001/0022403 A1 * | 9/2001 | Lee et al. ............... 257/781 |
| 2002/0096775 A1 | 7/2002 | Ning |
| 2002/0142592 A1 | 10/2002 | Barth et al. |
| 2004/0207093 A1 | 10/2004 | Sun et al. |
| 2006/0045974 A1 * | 3/2006 | Campbell et al. ........ 427/304 |
| 2006/0252250 A1 * | 11/2006 | Teng et al. ............. 438/618 |

* cited by examiner

*Primary Examiner*—Matthew Smith
*Assistant Examiner*—Jae Lee
(74) *Attorney, Agent, or Firm*—Schmeiser, Olsen & Watts; William D. Sabo

(57) ABSTRACT

A structure and a method of forming the structure. The structure including: an integrated circuit chip having a set of wiring levels from a first wiring level to a last wiring level, each wiring level including one or more damascene, dual-damascene wires or damascene vias embedded in corresponding interlevel dielectric levels, a top surface of a last damascene or dual-damascene wire of the last wiring level substantially coplanar with a top surface of a corresponding last interlevel dielectric level; a capping layer in direct physical and electrical contact with a top surface of the last damascene or dual-damascene wire, the last damascene or dual-damascene wire comprising copper; a dielectric passivation layer formed on a top surface of the last interlevel dielectric level; and an aluminum pad in direct physical and electrical contact with the capping layer, a top surface of the aluminum pad not covered by the dielectric passivation layer.

24 Claims, 6 Drawing Sheets

LOW COST BONDING PAD AND METHOD OF FABRICATING SAME

FIELD OF THE INVENTION

The present invention relates to the field of integrated circuits; more specifically, it relates to low cost bonding pad for an integrated circuit and a method of fabricating the low cost bonding pad.

BACKGROUND OF THE INVENTION

With many modern integrated circuits acquiring the status of commodities, the cost of manufacture has become ever more important. Despite, the low margins on certain integrated circuits, it is often more cost effective to fabricate them in the same factory and with the same processes used for high end integrated circuits in order to share tooling and processing. A significant cost of high-end integrated circuits is the complexity of the process used to form bonding pads. Therefore, a low cost bonding pad would be of benefit to the integrated circuit industry.

SUMMARY OF THE INVENTION

A first aspect of the present invention is a structure, comprising: an integrated circuit chip having a set of wiring levels from a first wiring level to a last wiring level, each wiring level including one or more damascene or dual-damascene wires or damascene vias embedded in corresponding interlevel dielectric levels, a top surface of a last damascene or dual-damascene wire of the last wiring level substantially coplanar with a top surface of a corresponding last interlevel dielectric level; a capping layer in direct physical and electrical contact with a top surface of the last damascene or dual-damascene wire, the last damascene or dual-damascene wire comprising copper; a dielectric passivation layer formed on a top surface of the last interlevel dielectric level; and an aluminum pad in direct physical and electrical contact with the capping layer, a top surface of the aluminum pad not covered by the dielectric passivation layer.

A second aspect of the present invention is a method, comprising: forming an integrated circuit chip having a set of wiring levels from a first wiring level to a last wiring level, each wiring level including one or more damascene or dual-damascene wires or damascene vias embedded in corresponding interlevel dielectric levels, a top surface of a last damascene or dual-damascene wire of the last wiring level substantially coplanar with a top surface of a corresponding last interlevel dielectric level; forming a capping layer in direct physical and electrical contact with a top surface of the last damascene or dual-damascene wire, the last damascene or dual-damascene wire comprising copper; forming a dielectric passivation layer formed on a top surface of the last interlevel dielectric level; and forming an aluminum pad in direct physical and electrical contact with the capping layer, a top surface of the aluminum pad not covered by the dielectric passivation layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planer with the surface of the dielectric layer to form a damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planer with the surface the dielectric layer to form dual-damascene wires and dual-damascene wires having integral dual-damascene vias. Alternatively, the trenches may be formed first.

Figure 1:
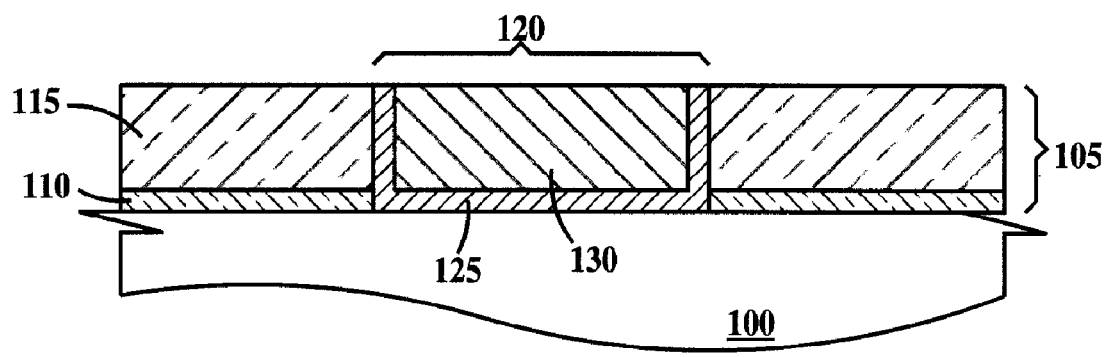
FIGS. 1 through 7 are cross-sections illustrating fabrication of a bonding pad according to an embodiment of the present invention.

FIGS. 1 through 7 are cross-sections illustrating fabrication of a bonding pad according to an embodiment of the present invention. In FIG. 1 formed on substrate 100 is an interlevel dielectric 105. Interlevel dielectric 105 includes a lower dielectric layer 110 and an upper dielectric layer 115 on top of the lower dielectric layer. Formed in interlevel dielectric 105 is an electrically conductive damascene or a dual-damascene wire 120. Wire 120 includes a liner 125 formed on the sides and bottom of a core conductor 130. A top surface of wire 120 is substantially (because there may be some dishing of the wire caused by the CMP process) coplanar with a top surface of upper dielectric layer 115. Wire 130 is the last (or highest) wiring level of a set of wiring levels from a first (or lowest) to the last wiring level of an integrated circuit chip. Substrate 100 includes all the wiring levels (not shown, but each comprising one or more damascene or dual damascene wires or vias in an interlevel dielectric) of the set of wiring levels from the first to a next to last wiring level as well as all the active (e.g. transistors and diodes) and passive elements (e.g. resistors, capacitors, inductors) that the set of wiring levels interconnect to form an integrated circuit.

In the example that wire 120 is a single-damascene wire, then the next to last wiring level is a via level. In the example that wire 120 is a dual-damascene wire, then the next to last wiring level is either a single or dual-damascene wiring level.

In one example, lower dielectric layer 110 is silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)). In one example, dielectric layer 110 is between about 5 nm and about 200 nm thick.

In one example, upper dielectric layer 115 is silicon dioxide ($SiO_2$) or a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, CA, organosilicate glass (SiCOH), and porous SiCOH. In one example, upper dielectric layer 115 is between about 300 nm and about 2,000 nm thick. A low K dielectric material has a relative permittivity of about 2.4 or less.

In one example, liner 125 comprises titanium (Ti), tantalum (Ta), titanium nitride (TiN), tantalum nitride (TaN) or combinations of layers thereof. In one example, core conductor 130 is copper (Cu).

Figure 2:
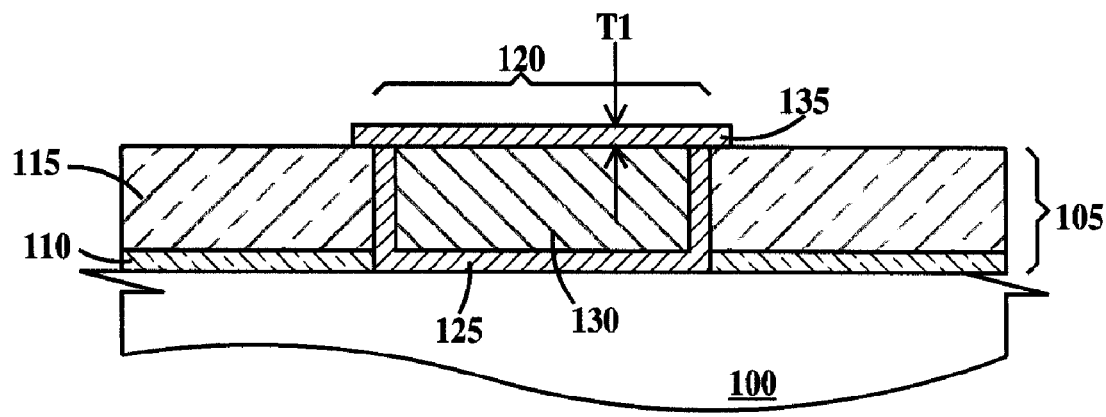

In FIG. 2, a electrically conductive capping layer 135 is electroless plated on the exposed top surface of wire 120. All regions of the top surface of wire 120 are coated with capping layer 135. Capping layer 135 may extend past the edges of wire 120 over upper dielectric layer 115. Capping layer 135 has a thickness T1. In one example, T1 is between about 20 nm and about 200 nm. Capping layer 135 besides acting as a Cu diffusion barrier when used in ball bonding contact pads (see FIG. 10 described infra), also acts as an adhesion layer when used in solder ball contact pads (see FIG. 11B described infra).

In one example, capping layer 135 is cobalt tungsten phosphide (CoWP). In one example, CoWP is formed by first coating the surface of wire 120 with palladium (Pd) by electroless displacement of copper. Then CoWP is electroless plated on the Pd using the Pd as a catalyst. CoWP plating solutions vary, but often contain a cobalt salt, a tungstic ($WO_4$) acid salt and a hypophosphite ($H_2PO_2$) acid salt. Once the surface of the Pd is coated with the CoWP, plating growth of the CoWP progresses through autocatalytic plating using the CoWP itself as a catalyst. Alternatively, by choice of plating bath composition, the Pd coating step may be eliminated. Other methods of forming CoWP layers known in the art may also be used.

Alternatively, capping layer 135 may comprise electrolessly plated NiP, CoP, NiCoP or NiWP.

Figure 3:
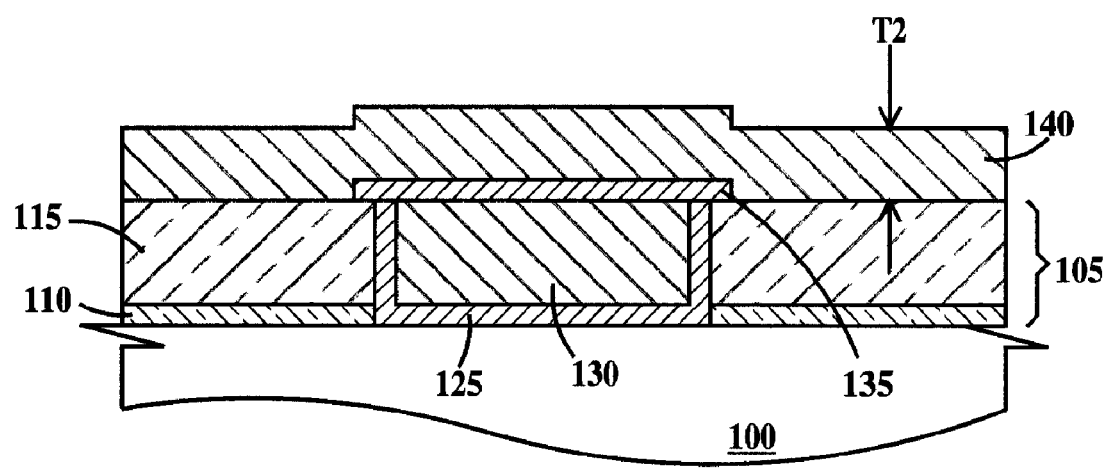

In FIG. 3, an aluminum (Al) layer 140 is formed over capping layer 135 and all exposed top surfaces of upper dielectric layer 115. In one example, Al layer 140 is formed by sputter deposition. Al layer 140 has a thickness of T2. In one example, T2 is between about 500 nm to about 4000 nm. In one example, Al layer 140 contains up to about 0.5% Cu by weight.

Figure 4:
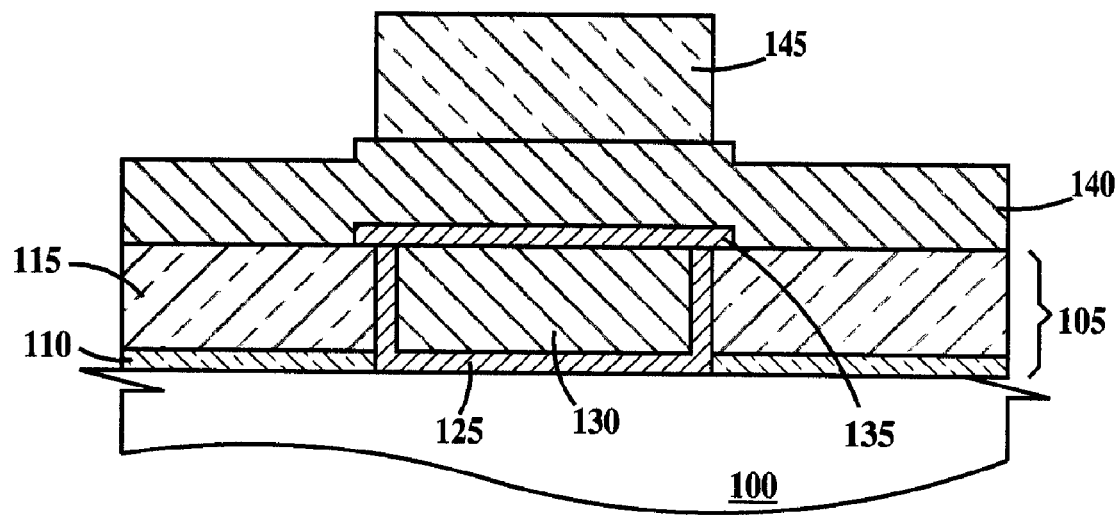

In FIG. 4, a photoresist layer is formed over Al layer 140 and a photoresist island 145 formed from the photoresist layer by exposing the photoresist layer to actinic radiation through a patterned photomask followed by a photoresist developing process.

Figure 5:
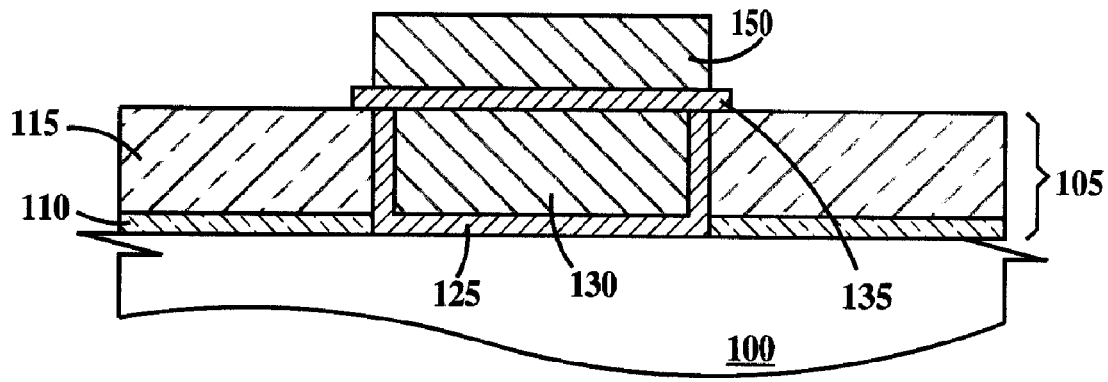

In FIG. 5, Al layer 140 (see FIG. 4) is etched to form an Al pad 150. Al pad 150 is fully landed on (i.e. does not overlap any edges of) capping layer 135 and photoresist island 150 (see FIG. 4) removed. In one example, Al layer 140 (see FIG. 4) is etched in a reactive ion etch (RIE) process using a mixture of chlorine ($Cl_2$) and trichloroborane ($BCl_3$).

Figure 6:
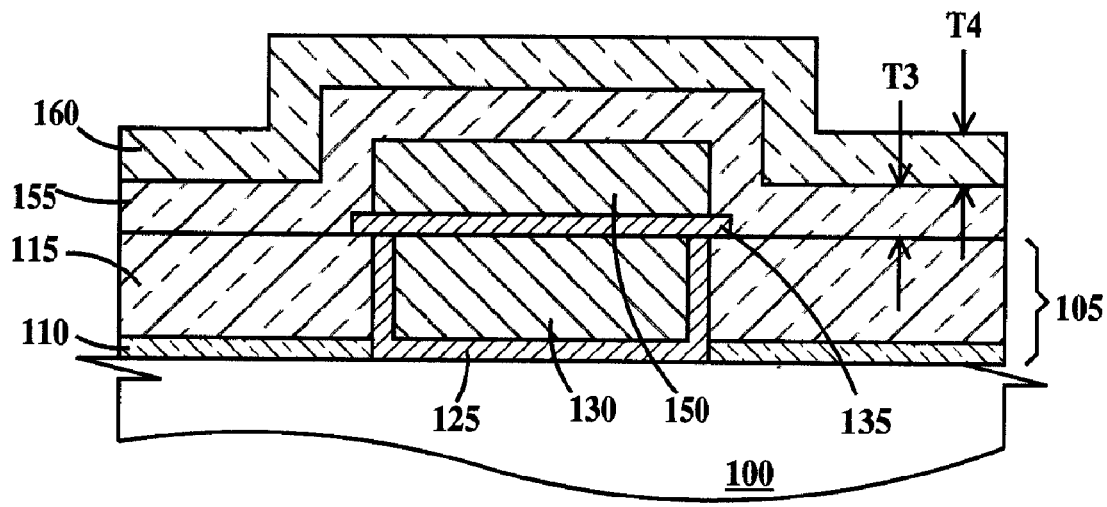

In FIG. 6, a first passivation layer 155 is formed over Al pad 150, any exposed regions of CoWP layer 135 and exposed top surfaces of upper dielectric layer 115. Formed on a top surface of first passivation layer 155 is a second passivation layer 160. First passivation layer 155 has a thickness of T3 and second passivation layer has a thickness of T4. In one example, T3 is between about 250 nm and about 2000 nm. In one example, T4 is between about 250 nm and about 2000 nm. In one example first passivation layer 155 comprises $Si_3N_4$. In one example, second passivation layer 160 comprises $SiO_2$. The values of T2 (see FIG. 3), T3 and T4 may be advantageously adjusted so T2>(T3+T4).

Figure 7:
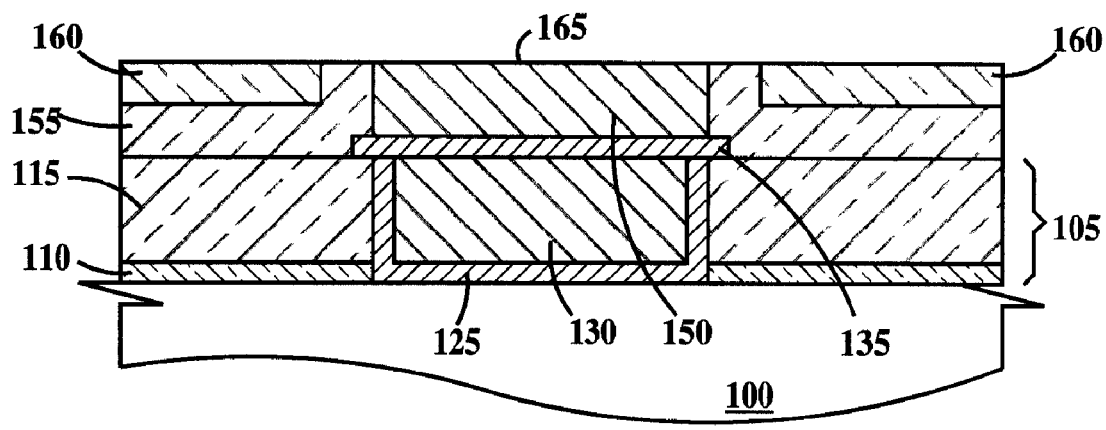

In FIG. 7, a CMP process is performed to remove first and second passivation layers 155 and 160 from over Al Pad 150, exposing a top surface 165 of the Al pad. Top surface 165 of Al pad 150 is substantially co-planar with top surface of second passivation layer 160 and exposed regions of first passivation layer 155.

Figure 8A:
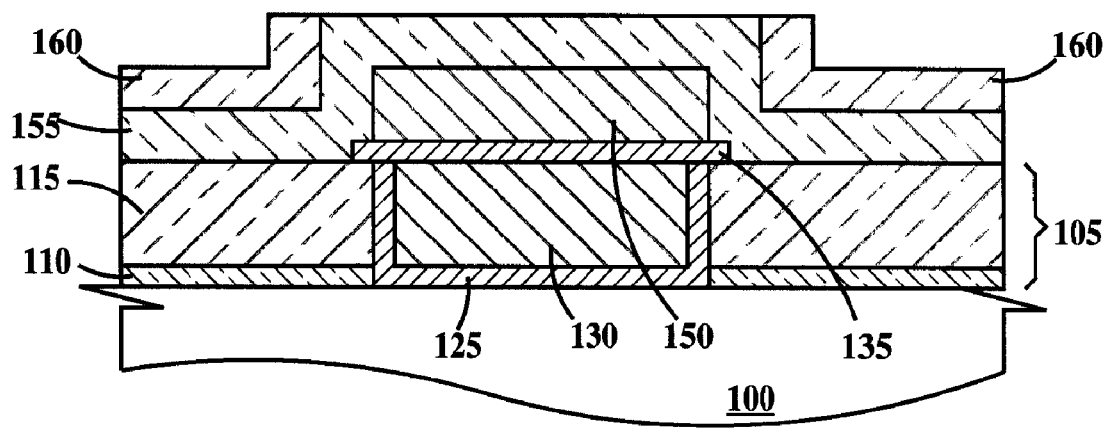
FIGS. 8A and 8B are cross-sections illustrating fabrication of a bonding pad using an alternative final passivation etch process.
Figure 8B:
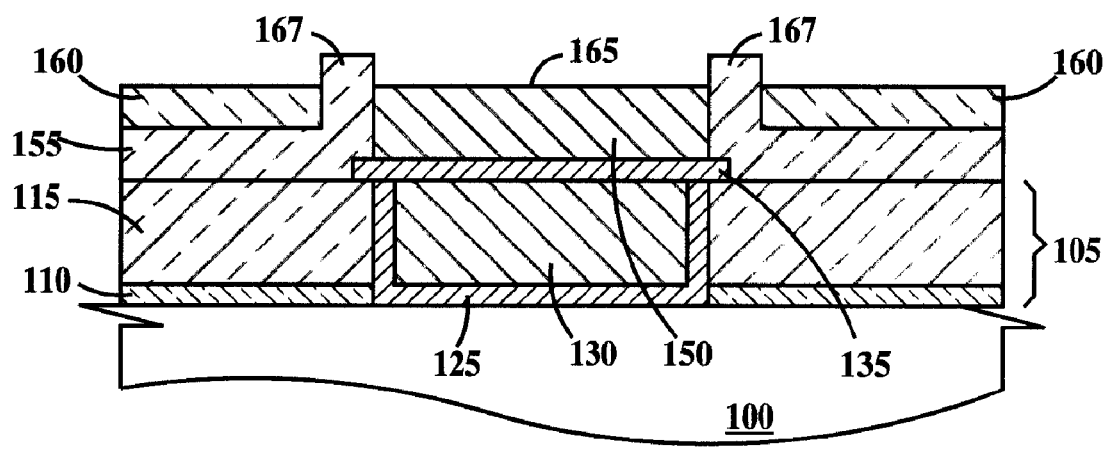

FIGS. 8A and 8B are cross-sections illustrating fabrication of a bonding pad using an alternative final passivation etch process. In FIG. 8A, a CMP process is performed to remove second passivation layer 160 from first passivation layer 155 over Al pad 150. In FIG. 8B, an RIE process using, for example tetrafluoromethane ($CF_4$), to remove first passivation layer 155 from over Al pad 150 thereby exposing the top surface 165 of the Al pad. Any RIE process that does not substantially attack Al but etches $Si_3N_4$ may be used. FIG. 8B is illustrated with an RIE process selective to etch $Si_3N_4$ over $SiO_2$ resulting in raised regions 167 of first passivation layer 155 extending higher than surface 165 of Al pad 150. Alternatively, if a non-selective RIE is used, regions 167 may be eliminated but second passivation layer 160 will be thinner than shown in FIG. 8B.

It should be noted in FIGS. 7 and 8B, that there is no dielectric in direct contact with the top surface of wire 120 or the top surface 165 of Al pad 150 or between the Al pad and wire 120.

Figure 9:
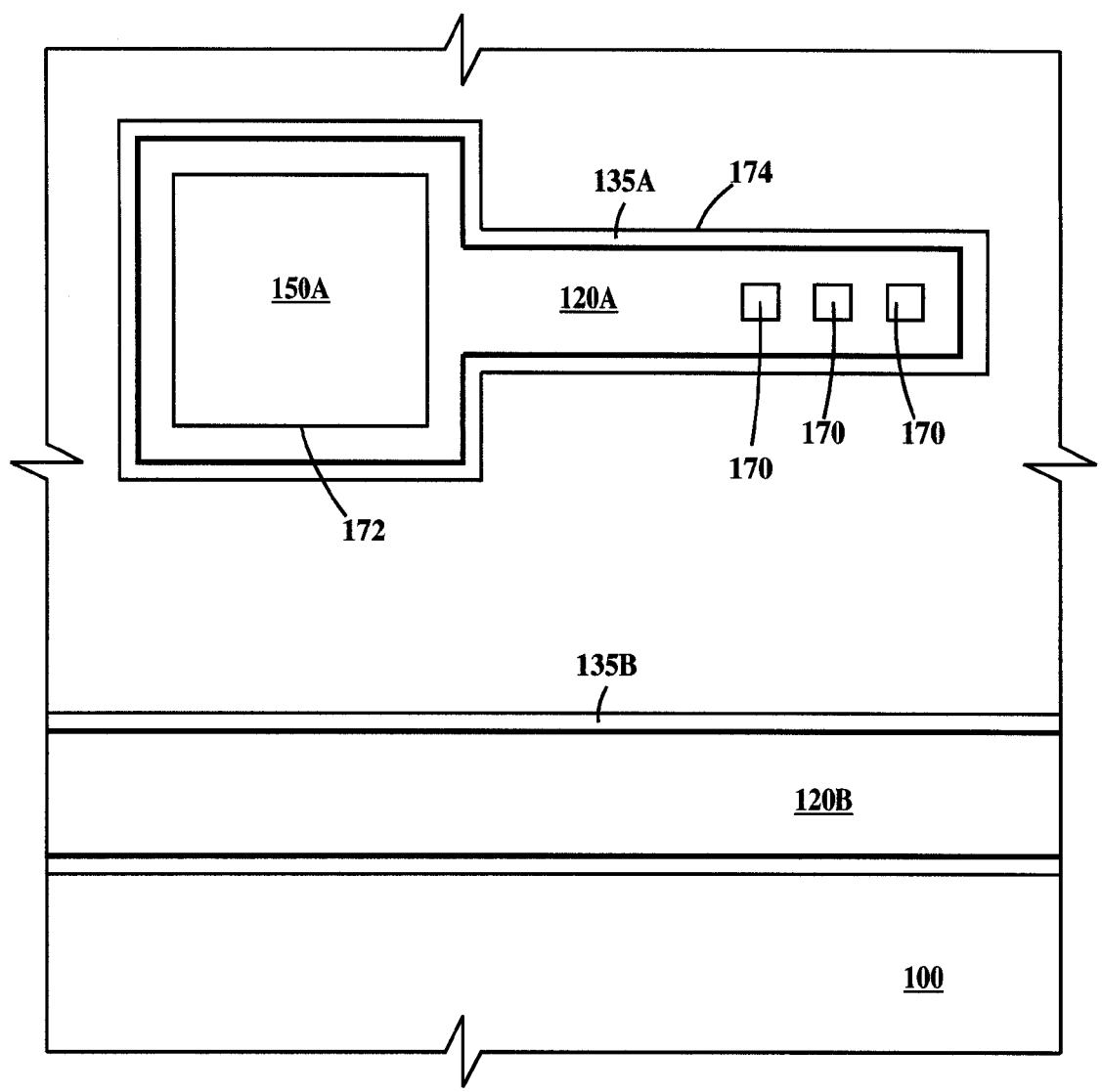
FIG. 9 is a plan view of a bonding pad according to an embodiment of the present invention.

FIG. 9 is a plan view of a bonding pad according to an embodiment of the present invention. In FIG. 9, a first conductive wire 120A and a second conductive wire 120B are formed over substrate 100. Wire 120A is electrically connected through vias 170 to wires in lower wiring levels (not shown for clarity). Vias 170 may be integral to wire 120A or formed separately in a distinct wiring level. Wire 120B is illustrated as passing through the vicinity of wire 120A as all wires in the last wiring level need not be connected to bonding pads. Layers 135A and 135B of CoWP are formed over the entire exposed top surfaces of wires 120A and 120B. An Al pad 150A formed over one end of wire 120A. A perimeter 172 of Al pad 150A is contained entirely within a perimeter 174 (heavy line) of capping layer 135A. It should be noted, because there is no interlevel dielectric between Al pad 150A and wire 120A, the region of wire 120A under Al pad 120 may be wider than other regions of wire 120A in order to accommodate the area of the Al pad.

Figure 10:
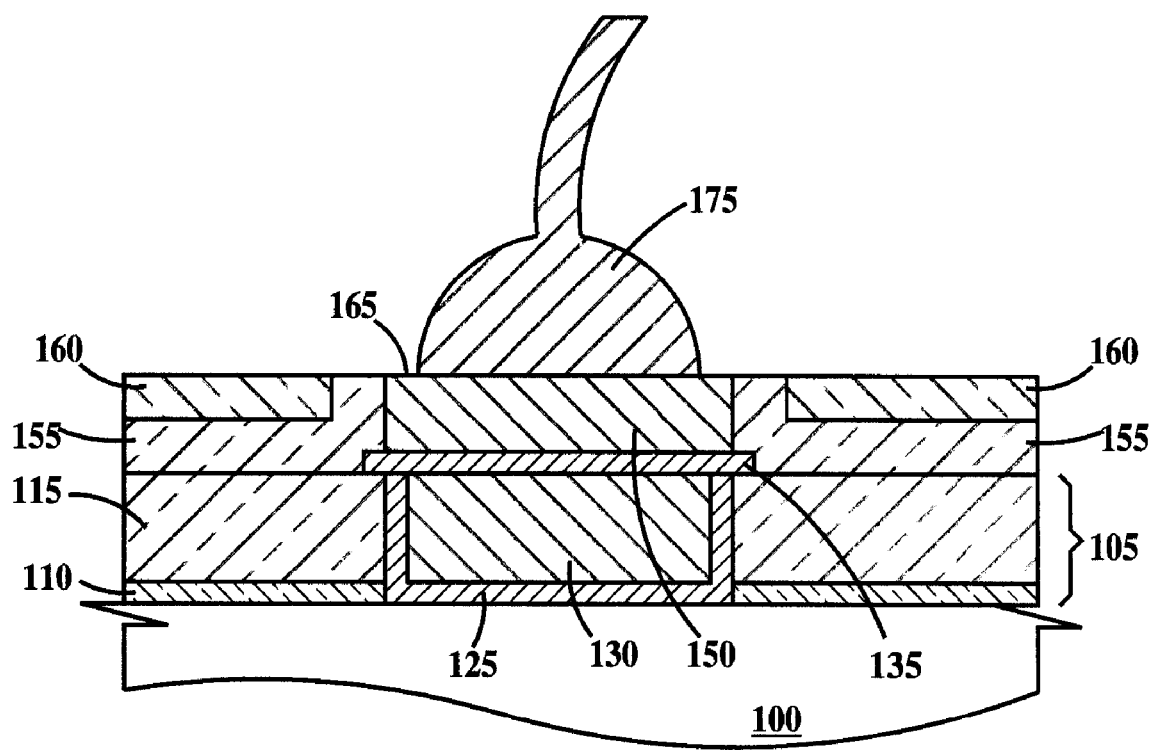
FIG. 10 is a cross-section illustrating fabrication of a ball bond on a bonding pad according to an embodiment of the present invention.

FIG. 10 is a cross-section illustrating fabrication of a ball bond on a bonding pad according to an embodiment of the present invention. In FIG. 10, a gold (Au) ball bond 175 is formed on Al pad 150. Generally, ball bonds are formed after individual integrated circuit chips have been diced from a wafer (substrate). Alternatively, an Al wire bond may be formed on Al pad 150.

Figure 11A:
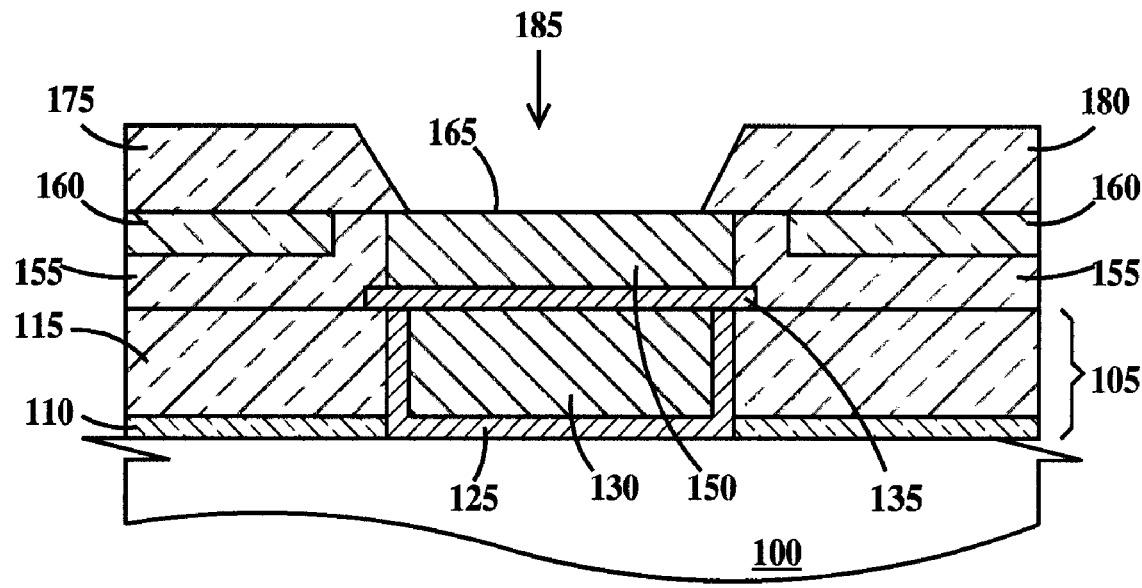
FIGS. 11A and 11B are cross-sections illustrating fabrication of a solder ball on a bonding pad according to an embodiment of the present invention.
Figure 11B:
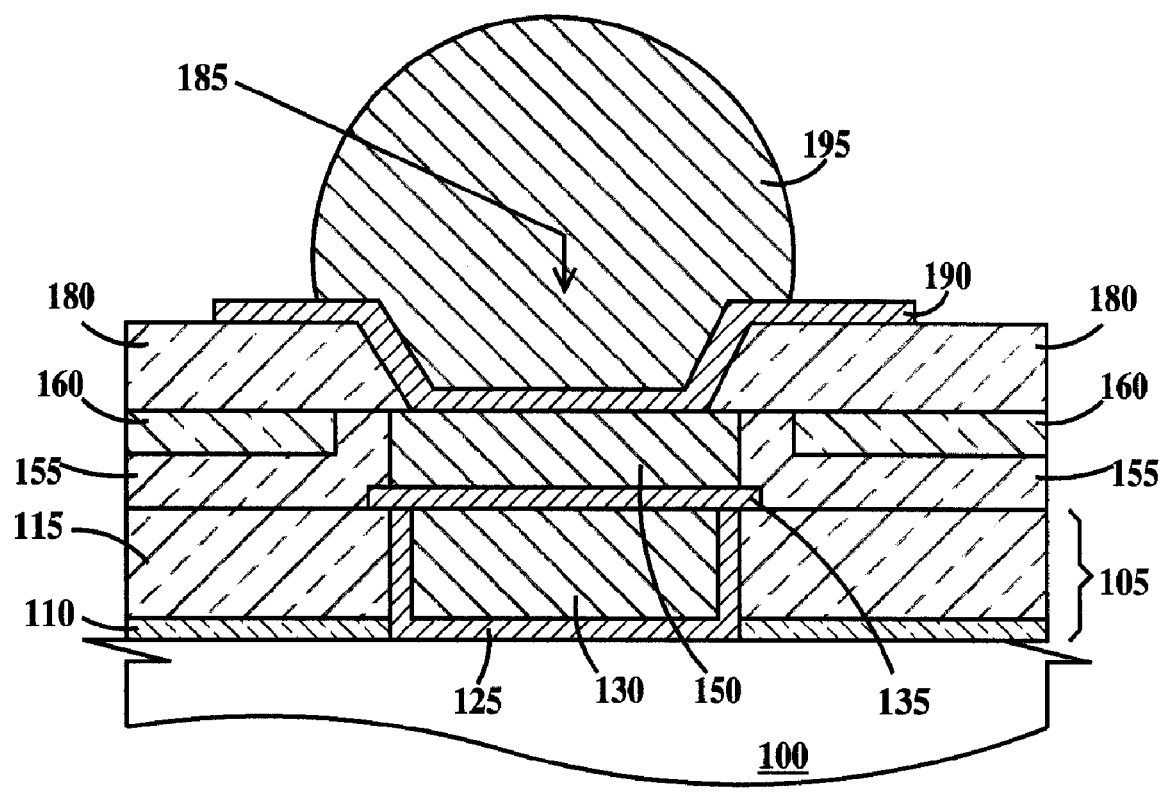

FIGS. 11A and 11B are cross-sections illustrating fabrication of a solder ball on a bonding pad according to an embodiment of the present invention. In FIG. 11A, a optional polyimide layer 180 is formed on top of Al pad 165 and a terminal via 185 formed in the polyimide layer over Al pad 150, thereby exposing top surface 165 of the Al pad. In a first example, via 185 is formed by applying a photoresist layer is over polyimide layer 180, exposing the photoresist layer to actinic radiation through a patterned photomask followed by photoresist developing, polyimide etching and photoresist removal. In a second example, polyimide layer 180 is formed from photoactive polyimide and via 185 is formed by exposing the polyimide layer to actinic radiation through a patterned photomask followed by polyimide developing. Polyimide layer 180 overlaps all edges (i.e. the perimeter) of Al pad 150.

In FIG. 11B, a ball limiting metallurgy (BLM) layer 190 is formed over via 185 and a solder ball formed on BLM layer 190. BLM layer 190 overlaps the entire perimeter of via 185 and extends onto the top surface of polyimide layer 180. Solder ball 195 is fully landed on BLM layer 190. Generally, BLM layer 190 and solder ball 195 are formed before individual integrated circuit chips have been diced from a wafer (substrate) by sequential evaporation through a single molybdenum (Mo) metal mask having knife edge holes etched into the mask followed by a heat cycle to reflow the evaporated solder ball into about a semi-spherical shape. In one example, BLM layer 190 comprises, from polyimide layer 180 upwards, a layer of chrome (Cr), a layer of Cu and a layer of Au. In one example, solder ball 195 comprises lead (Pb) and tin (Sn). In one example, solder ball 195 comprises Pb and up to about 5% Sn by weight. Solder balls 195 are also known as controlled chip collapse connections (C4).

The embodiments described supra require only one masking level and one level of passivation and is much less costly compared to other well-known methods of fabricating a ball bond bonding pads that require 3 mask/etch steps and two levels of passivation.

Thus, the embodiments of the present invention provide a low cost bonding pad for an integrated circuit and a method of fabricating the low cost bonding pad.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   an integrated circuit chip having a set of wiring levels from a first wiring level to a last wiring level, each wiring level including one or more damascene or dual-damascene wires or damascene vias embedded in corresponding interlevel dielectric levels, a top surface of a last damascene or dual-damascene wire of said last wiring level substantially coplanar with a top surface of a corresponding last interlevel dielectric level;
   a capping layer in physical and electrical contact with a top surface of said last damascene or dual-damascene wire, said last damascene or dual-damascene wire comprising copper;
   a dielectric passivation layer formed on a top surface of said last interlevel dielectric level; and
   an aluminum pad having a bottom surface, a top surface and sidewalls connecting said top and bottom surfaces, said bottom surface of said aluminum pad in physical and electrical contact with said capping layer, said top surface of said aluminum pad coplanar with a top surface of said dielectric passivation layer, said dielectric passivation layer in direct contact with said sidewalls of said aluminum pad.

2. The structure of claim 1, further including:
   a ball or wire bond formed on a top surface of said aluminum pad.

3. The structure of claim 1, further including:
   a polyimide layer formed on a top surface of said aluminum pad and a top surface of said dielectric layer;
   a terminal via formed in said polyimide layer, said top surface of said aluminum pad exposed in a bottom of said terminal via;
   a ball limiting metallurgy layer in direct physical and electrical contact with said top surface of said aluminum pad; and
   a solder ball in direct physical and electrical contact with a top surface of said ball limiting metallurgy layer.

4. The structure of claim 1, wherein there is no passivation layer in direct contact with said top surface of said aluminum pad and there is no passivation layer between said aluminum pad and said last damascene or dual-damascene wire.

5. The structure of claim 1, wherein said capping layer covers the entire top surface of said last damascene or dual-damascene wire.

6. The structure of claim 1, wherein a perimeter of said last damascene or dual-damascene wire is located entirely within a perimeter of said capping layer.

7. The structure of claim 1, wherein a perimeter of said aluminum pad is located entirely within a perimeter of said capping layer.

8. The structure of claim 1, wherein said capping layer comprises CoWP.

9. The structure of claim 1, wherein said capping layer comprises NiP, CoP, NiCoP, or NiWP.

10. A method, comprising:
    forming an integrated circuit chip having a set of wiring levels from a first wiring level to a last wiring level, each wiring level including one or more damascene or dual-damascene wires or damascene vias embedded in corresponding interlevel dielectric levels, a top surface of a last damascene or dual-damascene wire of said last wiring level substantially coplanar with a top surface of a corresponding last interlevel dielectric level;
    forming a capping layer in direct physical and electrical contact with a top surface of said last damascene or dual-damascene wire, said last damascene or dual-damascene wire comprising copper;
    forming a dielectric passivation layer formed on a top surface of said last interlevel dielectric level; and
    forming an aluminum pad having a bottom surface, a top surface and sidewalls connecting said top and bottom surfaces, said bottom surface of said aluminum pad in physical and electrical contact with said capping layer, said top surface of said aluminum pad coplanar with a top surface of said dielectric passivation layer, said dielectric passivation layer in direct contact with said sidewalls of said aluminum pad.

11. The method of claim 10, further including:
    forming a ball or wire bond formed on a top surface of said aluminum pad.

12. The method of claim 10, further including:
  forming a polyimide layer formed on a top surface of said aluminum pad and a top surface of said dielectric layer;
  forming a terminal via formed in said polyimide layer, said top surface of said aluminum pad exposed in a bottom of said terminal via;
  forming a ball limiting metallurgy layer in direct physical and electrical contact with said top surface of said aluminum pad; and
  forming a solder ball in direct physical and electrical contact with a top surface of said ball limiting metallurgy layer.

13. The method of claim 10, wherein there is no passivation layer in direct contact with said top surface of said aluminum pad and there is no passivation layer between said aluminum pad and said last damascene or dual-damascene wire.

14. The method of claim 10, wherein said capping layer covers the entire top surface of said last damascene or dual-damascene wire.

15. The method of claim 10, wherein a perimeter of said last damascene or dual-damascene wire is located entirely within a perimeter of said capping layer.

16. The method of claim 10, wherein a perimeter of said aluminum pad is located entirely within a perimeter of said capping layer.

17. The method of claim 10, wherein said capping layer comprises CoWP.

18. The method of claim 10, wherein said capping layer comprises NiP, CoP, NiCoP, or NiWP.

19. The method of claim 10, wherein said capping layer is formed by electroless plating.

20. The method of claim 10, wherein said aluminum pad is formed prior to formation of said passivation layer, said passivation layer covering said aluminum pad and further including performing a chemical-mechanical polish of said passivation layer, said chemical-mechanical polish of said passivation layer exposing said top surface of said aluminum pad.

21. The structure of claim 1, wherein said dielectric passivation layer comprises a first dielectric layer on top of a second dielectric layer, a ring of said first dielectric layer immediately adjacent to said aluminum boding pad coplanar with said top surface of said dielectric passivation layer, said second dielectric layer not contacting said aluminum bonding pad.

22. The structure of claim 1, wherein said damascene wire or said dual-damascene wire of said last wiring level further comprises a conductive liner formed on sidewalls and a bottom surface of said damascene wire or said dual-damascene wire of said last wiring level.

23. The method of claim 10, wherein said dielectric passivation layer comprises a first dielectric layer on top of a second dielectric layer, a ring of said first dielectric layer immediately adjacent to said aluminum boding pad coplanar with said top surface of said dielectric passivation layer, said second dielectric layer not contacting said aluminum bonding pad.

24. The method of claim 10, wherein said damascene wire or said dual-damascene wire of said last wiring level further comprises a conductive liner formed on sidewalls and a bottom surface of said damascene wire or said dual-damascene wire of said last wiring level.

* * * * *